(12) United States Patent
Saeidi et al.

(10) Patent No.: US 9,629,233 B2
(45) Date of Patent: Apr. 18, 2017

(54) TECHNIQUES FOR IMPLEMENTING A SYNTHETIC JET TO COOL A DEVICE

(71) Applicant: QUALCOMM Incorporated, San Diego, CA (US)

(72) Inventors: Mehdi Saeidi, San Diego, CA (US);
Arpit Mittal, San Diego, CA (US);
Emil Rahim, San Diego, CA (US);
Rajat Mittal, San Diego, CA (US);
Kambiz Samadi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 3 days.

(21) Appl. No.: 14/732,787

(22) Filed: Jun. 8, 2015

(65) Prior Publication Data
US 2016/0360606 A1    Dec. 8, 2016

(51) Int. Cl.
*H05K 7/20*  (2006.01)
*H05K 1/02*  (2006.01)
(Continued)

(52) U.S. Cl.
CPC ........... *H05K 1/0203* (2013.01); *G05B 15/02* (2013.01); *H05K 7/20145* (2013.01); *H05K 7/20209* (2013.01)

(58) Field of Classification Search
CPC ..... G06F 1/181–1/182; G06F 1/1601–1/1611; G06F 1/1613–1/1698; G06F 1/18–1/189; H05K 7/20218–7/20381; H05K 7/20409–7/20418; H05K 7/20009–7/202; H05K 5/00–5/069; H05K 7/00–7/186; H01L 23/367–23/3677; H01L 23/473; H01L 23/46–23/467

USPC ...... 361/676–678, 679.46–679.54, 688–727, 361/679.01–679.45, 679.55–679.61, 756, 361/741, 686, 687, 787, 789, 794,
(Continued)

(56) References Cited

U.S. PATENT DOCUMENTS 6,588,497 B1    7/2003  Glezer et al.
8,430,644 B2    4/2013  Mahalingam et al.
(Continued)

OTHER PUBLICATIONS

International Search Report and Written Opinion—PCT/US2016/031143—ISA/EPO—Aug. 30, 2016.

*Primary Examiner* — Anthony Haughton
*Assistant Examiner* — Razmeen Gafur
(74) *Attorney, Agent, or Firm* — Muncy, Geissler, Olds & Lowe, P.C.

(57) ABSTRACT

Methods and apparatus for implementing a synthetic jet to cool a device are provided. Examples of the techniques keep a device case cool enough to be hand-held, while allowing a higher temperature of a circuit component located in the case, to maximize circuit performance. In an example, provided is a mobile device including a synthetic jet configured to transfer heat within the mobile device. The synthetic jet can be embedded in a circuit board inside the mobile device such that the circuit board defines at least a portion of a chamber of the synthetic jet and defines an orifice of the synthetic jet. The device case can define at least one fluid channel inside the mobile device. Also, the circuit board can define a synthetic jet outlet configured to direct a fluid at the at least one fluid channel. Also provided are methods for controlling a synthetic jet.

27 Claims, 7 Drawing Sheets

(51) Int. Cl.
 *G05B 15/02* (2006.01)
 *H01L 23/473* (2006.01)

(58) Field of Classification Search
 USPC .......... 361/807–810; 165/80.1–80.5, 104.33,
 165/185; 174/15.1–15.3, 16.1–16.3, 547,
 174/548; 257/712–722, E23.088;
 24/453, 458–459; 454/184; 312/236,
 312/223.1–223.3; 455/575.1–575.9;
 349/56–60; 348/787, 789, 794
 See application file for complete search history.

(56) References Cited

U.S. PATENT DOCUMENTS

| | | | |
|---|---|---|---|
| 8,584,735 B2 | 11/2013 | Gerlach | |
| 2005/0111185 A1* | 5/2005 | Bhattacharya | H05K 7/20009 361/690 |
| 2006/0050482 A1* | 3/2006 | Glezer | H05K 7/20172 361/691 |
| 2006/0060331 A1* | 3/2006 | Glezer | F28D 15/0266 165/104.29 |
| 2006/0196638 A1 | 9/2006 | Glezer et al. | |
| 2007/0127210 A1* | 6/2007 | Mahalingam | G06F 1/20 361/700 |
| 2008/0006393 A1* | 1/2008 | Grimm | H05K 7/20172 165/84 |
| 2008/0043061 A1* | 2/2008 | Glezer | H02K 33/18 347/53 |
| 2008/0120981 A1* | 5/2008 | Dean | F04F 7/00 62/6 |
| 2008/0295997 A1* | 12/2008 | Heffington | F15D 1/009 165/84 |
| 2009/0080157 A1* | 3/2009 | Varadarajan | G06F 1/203 361/697 |
| 2009/0219686 A1* | 9/2009 | Ishikawa | F04F 7/00 361/692 |
| 2010/0054973 A1* | 3/2010 | Arik | F04B 43/095 417/437 |
| 2010/0065260 A1* | 3/2010 | Sakamoto | B06B 1/045 165/121 |
| 2010/0096967 A1* | 4/2010 | Marinus | F04D 33/00 313/46 |
| 2010/0110635 A1* | 5/2010 | Jones | F21V 29/02 361/702 |
| 2010/0263838 A1* | 10/2010 | Mahalingam | F25D 17/02 165/104.31 |
| 2011/0024092 A1* | 2/2011 | Gerlach | F28D 1/05333 165/104.34 |
| 2011/0141691 A1* | 6/2011 | Slaton | H05K 7/20145 361/690 |
| 2011/0164383 A1* | 7/2011 | Kadijk | H05K 7/20972 361/690 |
| 2012/0075787 A1* | 3/2012 | MacDonald | G06F 1/203 361/679.5 |
| 2013/0068427 A1 | 3/2013 | Williams et al. | |
| 2013/0240182 A1 | 9/2013 | Wang et al. | |
| 2014/0002991 A1* | 1/2014 | Sharma | F21V 29/63 361/694 |
| 2014/0049970 A1* | 2/2014 | de Bock | H01L 41/0926 362/373 |
| 2014/0060783 A1* | 3/2014 | Ciulla | F04B 43/046 165/109.1 |
| 2014/0240993 A1* | 8/2014 | Seeley | F04B 43/046 362/382 |
| 2014/0273796 A1* | 9/2014 | Giammattei | F04B 43/046 454/251 |
| 2014/0299674 A1* | 10/2014 | Uibel | H01L 23/4735 239/102.2 |
| 2015/0041104 A1 | 2/2015 | De Bock et al. | |

* cited by examiner

TECHNIQUES FOR IMPLEMENTING A SYNTHETIC JET TO COOL A DEVICE

INTRODUCTION

This disclosure relates generally to electronics, and more specifically, but not exclusively, to methods, apparatuses, that implement a synthetic jet to cool a device.

There is a need for increased computing performance from hand-held devices such as cell phones, navigation devices, music players, video players, tablet computers, and similar consumer products. However, these performance increases come with attendant increases in temperature generated by integrated circuits (ICs) and other components within the hand-held devices. The heat inside an IC and the other components can cause thermal runaway of the IC and the other components, which can damage or even destroy the IC and the other components. The heat inside an IC can also cause onset of IC reliability issues. Thus, a first thermal limit for hand-held devices is a chip junction temperature limit which is based on a combination of chip junction temperatures: 1.) a chip junction temperature at which an onset of thermal runaway occurs, and 2.) a chip junction temperature at which IC reliability diminishes. A typical chip junction temperature limit is between 80 C and 90 C.

The increases in temperature generated by the ICs and other components within the hand-held devices must be dissipated somehow, and conventional thermal management techniques rely on heat dissipation by conducting heat away from the IC with a solid metal heat spreader or a solid metal heatsink. The heat spreader and the heatsink spread and conduct the heat to a case of the hand-held device. The heat then dissipates through the case of the hand-held device and to the atmosphere adjacent to the case and things in contact with the case. Though functional, the conventional heat spreaders and heatsinks can be bulky and heavy. Further, conventional heat dissipation techniques that use conduction, when used in combination with the increased heat generated by increased computing performance ICs and other components can raise the temperature of a hand-held device case to a point that causes user discomfort or even burns on a user's hand. Accordingly, a second thermal limit for hand-held devices is a case temperature limit (also known as a skin temperature). A typical device case temperature limit is between 40 C and 45 C. Thus, for most real use cases, as device case temperature rises, the device case temperature limit is violated before the chip junction temperature limit is violated. As a result, IC performance is limited far below an IC performance corresponding to the chip junction temperature limit, in order to not exceed the device case temperature limit.

Accordingly, there are previously unaddressed and long-felt industry needs for methods and apparatus that improve upon conventional methods and apparatus, including the provided improved methods and improved apparatus.

SUMMARY

This summary provides a basic understanding of some aspects of the present teachings. This summary is not exhaustive in detail, and is neither intended to identify all critical features, nor intended to limit the scope of the claims. Exemplary methods and apparatus for implementing a synthetic jet to cool a device are provided.

In an example, provided a mobile device that includes a synthetic jet embedded in a circuit board inside the mobile device. The circuit board both defines at least a portion of a chamber of the synthetic jet and defines an orifice of the synthetic jet. The mobile device also includes a case defining at least one channel inside the mobile device. Further, the circuit board defines a synthetic jet outlet configured to direct a fluid at the at least one channel. The mobile device can also include a frame adjacent to a case of the mobile device, such that the synthetic jet outlet is aimed at a cavity that is at least partially defined by the frame. In an example, the mobile device can also include a frame adjacent to the case and an integrated circuit. The circuit board and the frame define a cavity configured to direct fluid adjacent to the integrated circuit, which is located at least in part in at least a portion of the cavity. In a further example, the channel is substantially coplanar with the circuit board. In yet another example, the synthetic jet includes at least one piezoelectric diaphragm. The mobile device can also include an application-specific integrated circuit configured to control the synthetic jet by varying a frequency of an AC voltage applied to the synthetic jet. In a further example, provided is a non-transitory computer-readable medium, comprising lithographic device-executable instructions stored thereon that are configured to cause a lithographic device to fabricate at least a part of the mobile device.

In an example, provided is an apparatus configured to control a synthetic jet. The apparatus includes means for receiving case temperature data indicating a skin temperature of a case and means for initiating, if the skin temperature is greater than the skin temperature threshold, applying a control voltage to actuate the synthetic jet. The apparatus can further include means for reducing, if the skin temperature is greater than the skin temperature threshold, a clock frequency applied in an integrated circuit. In an example, the apparatus can further include means for receiving junction temperature data indicating a junction temperature of an integrated circuit located in the case and means for reducing, if the junction temperature is greater than a junction temperature threshold, a clock frequency applied in the integrated circuit. In an example, the case temperature data indicates the skin temperature of at least one of the exterior of the case, the interior of the case, and a portion of the case that defines a channel through which the synthetic jet is configured to pass fluid. In another example, at least a part of the means for initiating applying the control voltage to actuate the synthetic jet is integrated on a semiconductor die. Further, the apparatus can include at least one of a mobile device, a terminal, a music player, a video player, an entertainment unit, a navigation device, a communications device, a personal digital assistant, a fixed location data unit, a tablet, and a computer, of which the means for initiating applying the control voltage to actuate the synthetic jet is a constituent part. In an example, provided is a non-transitory computer-readable medium, comprising lithographic device-executable instructions stored thereon that are configured to cause a lithographic device to fabricate at least a part of the apparatus.

In another example, provided is an apparatus configured to control a synthetic jet. The apparatus includes a processor and a memory coupled to the processor. The memory is configured to cause the processor to receive case temperature data indicating a skin temperature of a case and to initiate, if the skin temperature is greater than a skin temperature threshold, applying a control voltage to actuate the synthetic jet. In an example, the memory is further configured to cause the processor to reduce, if the skin temperature is greater than the skin temperature threshold, a clock frequency applied in an integrated circuit. In another example, the memory is further configured to cause the processor to receive junction temperature data indicating a junction temperature of an integrated circuit located in a case and to reduce, if the junction temperature is greater than a junction temperature threshold, a clock frequency applied in the integrated circuit. Further, in another example, the case temperature data indicates the skin temperature of at least one of the exterior of the case, the interior of the case, and a portion of the case that defines a channel through which the synthetic jet is configured to pass fluid. In an example, at least a part of the processor is integrated on a semiconductor die. In an example, the apparatus includes at least one of a mobile device, a terminal, a music player, a video player, an entertainment unit, a navigation device, a communications device, a personal digital assistant, a fixed location data unit, a tablet, and a computer, with which the processor is integrated. Further, in an example, the processor is at least one of a microprocessor, a microcontroller, a digital signal processor, a field programmable gate array, a programmable logic device, an application-specific integrated circuit, a controller, a non-generic special-purpose processor, a state machine, gated logic, a discrete hardware component, and a dedicated hardware finite state machine. In an example, provided is a non-transitory computer-readable medium, comprising lithographic device-executable instructions stored thereon that are configured to cause a lithographic device to fabricate at least a part of the apparatus.

In an example, provided is a method for controlling a synthetic jet. The method includes receiving case temperature data indicating a skin temperature of a case and initiating, if the skin temperature is greater than a skin temperature threshold, applying a control voltage to actuate the synthetic jet. The method can further include reducing, if the skin temperature is greater than the skin temperature threshold, a clock frequency applied in the integrated circuit. In an example, the method can include receiving junction temperature data indicating a junction temperature of an integrated circuit located in the case and reducing, if the junction temperature is greater than a junction temperature threshold, a clock frequency applied in an integrated circuit. Further, the case temperature data can indicate the skin temperature of at least one of the exterior of the case, the interior of the case, and a portion of the case that defines a channel through which the synthetic jet is configured to pass fluid.

In a further example, provided is a non-transitory computer-readable medium, comprising processor-executable instructions stored thereon that are configured to cause a processor to execute at least a part of the aforementioned method. The non-transitory computer-readable medium can be integrated with a device, such as a mobile device, a terminal, a music player, a video player, an entertainment unit, a navigation device, a communications device, a personal digital assistant, a fixed location data unit, a tablet, a computer, or a combination thereof. Further, in an example, the processor is at least one of a microprocessor, a microcontroller, a digital signal processor, a field programmable gate array, a programmable logic device, an application-specific integrated circuit, a controller, a non-generic special-purpose processor, a state machine, gated logic, a discrete hardware component, and a dedicated hardware finite state machine.

The foregoing broadly outlines some of the features and technical advantages of the present teachings in order that the detailed description and drawings can be better understood. Additional features and advantages are also described in the detailed description. The conception and disclosed examples can be used as a basis for modifying or designing other devices for carrying out the same purposes of the present teachings. Such equivalent constructions do not depart from the technology of the teachings as set forth in the claims. The inventive features that are characteristic of the teachings, together with further objects and advantages, are better understood from the detailed description and the accompanying figures. Each of the figures is provided for the purpose of illustration and description only, and does not limit the present teachings.

BRIEF DESCRIPTION OF THE DRAWINGS

The accompanying drawings are presented to describe examples of the present teachings, and are not limiting.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Introduction

Methods and apparatus for implementing a synthetic jet to cool a device are provided. Examples of the provided techniques keep a device case cool enough to be hand-held, while allowing a higher temperature of an integrated circuit located in the case, to maximize integrated circuit (IC) performance. In an example, provided is a mobile device that includes a synthetic jet configured to transfer heat within the mobile device. The mobile device includes the synthetic jet embedded in a circuit board inside the mobile device. The circuit board both defines at least a portion of a chamber of the synthetic jet and defines an orifice of the synthetic jet. A case defines at least one channel inside the mobile device. Also, the circuit board defines a synthetic jet outlet configured to direct a fluid at the channel. In addition, provided are methods for controlling a synthetic jet.

At least one of the exemplary apparatuses and/or exemplary methods disclosed herein advantageously addresses the previously unaddressed and long-felt industry needs, as well as other previously unidentified needs, and mitigates shortcomings of the conventional methods and the conventional apparatus. For example, an advantage provided by at least one example of the disclosed apparatuses and/or at least one example of the methods disclosed herein is an improvement in device performance over conventional devices, while not exceeding a limit for a temperature of an exterior surface of a case. Further, an advantage provided by at least one example of the apparatuses and/or at least one example of the methods disclosed herein is that an IC power budget can be increased. In at least one example, an additional advantage is that a temperature of an exterior surface of a case is decoupled from a temperature of a junction inside an IC housed in the case.

Examples are disclosed in this application's text and drawings. Alternate examples can be devised without departing from the scope of the disclosure. Additionally, conventional elements of the current teachings may not be described in detail, or may be omitted, to avoid obscuring aspects of the current teachings.

Abbreviations

The following list of abbreviations, acronyms, and terms is provided to assist in comprehending the current disclosure, and are not provided as limitations.

AC—Alternating Current
ASIC—Application-Specific Integrated Circuit
DC—Direct Current
DL—Downlink
DVCS—Dynamic Voltage and Clock Scaling
PCB—Printed Circuit Board
SOC—System On a Chip
$T_J$—Junction Temperature
$T_{SKIN}$—Temperature of an Exterior Surface of a Case
UE—User Equipment
UL—Uplink As used herein, the term "exemplary" means "serving as an example, instance, or illustration." Any example described as "exemplary" is not necessarily to be construed as preferred or advantageous over other examples. Likewise, the term "examples" does not require that all examples include the discussed feature, advantage, or mode of operation. Use of the terms "in one example," "an example," "in one feature," and/or "a feature" in this specification does not necessarily refer to the same feature and/or example. Furthermore, a particular feature and/or structure can be combined with one or more other features and/or structures. Moreover, at least a portion of the apparatus described hereby can be configured to perform at least a portion of a method described hereby.

It should be noted that the terms "connected," "coupled," and any variant thereof, mean any connection or coupling between elements, either direct or indirect, and can encompass a presence of an intermediate element between two elements that are "connected" or "coupled" together via the intermediate element. Coupling and connection between the elements can be physical, logical, or a combination thereof. Elements can be "connected" or "coupled" together, for example, by using one or more wires, cables, printed electrical connections, electromagnetic energy, and the like. The electromagnetic energy can have a wavelength at a radio frequency, a microwave frequency, a visible optical frequency, an invisible optical frequency, and the like, as practicable. These are several non-limiting and non-exhaustive examples.

The term "signal" can include any signal such as a data signal, an audio signal, a video signal, a multimedia signal, an analog signal, a digital signal, and the like. Information and signals described herein can be represented using any of a variety of different technologies and techniques. For example, data, an instruction, a process step, a command, information, a signal, a bit, a symbol, and the like that are references herein can be represented by a voltage, a current, an electromagnetic wave, a magnetic field, a magnetic particle, an optical field, and optical particle, and/or any practical combination thereof, depending at least in part on the particular application, at least in part on the desired design, at least in part on the corresponding technology, and/or at least in part on like factors.

A reference using a designation such as "first," "second," and so forth does not limit either the quantity or the order of those elements. Rather, these designations are used as a convenient method of distinguishing between two or more elements or instances of an element. Thus, a reference to first and second elements does not mean that only two elements can be employed, or that the first element must necessarily precede the second element. Also, unless stated otherwise, a set of elements can comprise one or more elements. In addition, terminology of the form "at least one of: A, B, or C" or "one or more of A, B, or C" or "at least one of the group consisting of A, B, and C" used in the description or the claims can be interpreted as "A or B or C or any combination of these elements." For example, this terminology can include A, or B, or C, or A and B, or A and C, or A and B and C, or 2A, or 2B, or 2C, and so on.

The terminology used herein is for the purpose of describing particular examples only and is not intended to be limiting. As used herein, the singular forms "a," "an," and "the" include the plural forms as well, unless the context clearly indicates otherwise. Further, the terms "comprises," "comprising," "includes," and "including," specify a presence of a feature, an integer, a step, an operation, an element, a component, and the like, but do not necessarily preclude a presence or an addition of another feature, integer, step, operation, element, component, and the like.

The fluids described herein can include gases such as air, nitrogen, inert gases, and the like.

In at least one example, the provided apparatuses can be a part of an electronic device such as, but not limited to, at least one of a mobile device, a navigation device (e.g., a global positioning system receiver), a wireless device, a computer, a tablet, a camera, an audio player, a camcorder, a game console, and the like.

The term "mobile device" can describe, and is not limited to, at least one of a mobile phone, a mobile communication device, a pager, a personal digital assistant, a personal information manager, a personal data assistant, a mobile hand-held computer, a portable computer, a tablet computer, a wireless device, a wireless modem, other types of portable electronic devices typically carried by a person and having communication capabilities (e.g., wireless, cellular, infrared, short-range radio, etc.), any other device that is capable of receiving wireless communication signals, a combination thereof, and the like. Further, the terms "user equipment" (UE), "mobile terminal," "user device," "mobile device," "device," and "wireless device" can be interchangeable.

DESCRIPTION OF THE FIGURES

Figure 1:
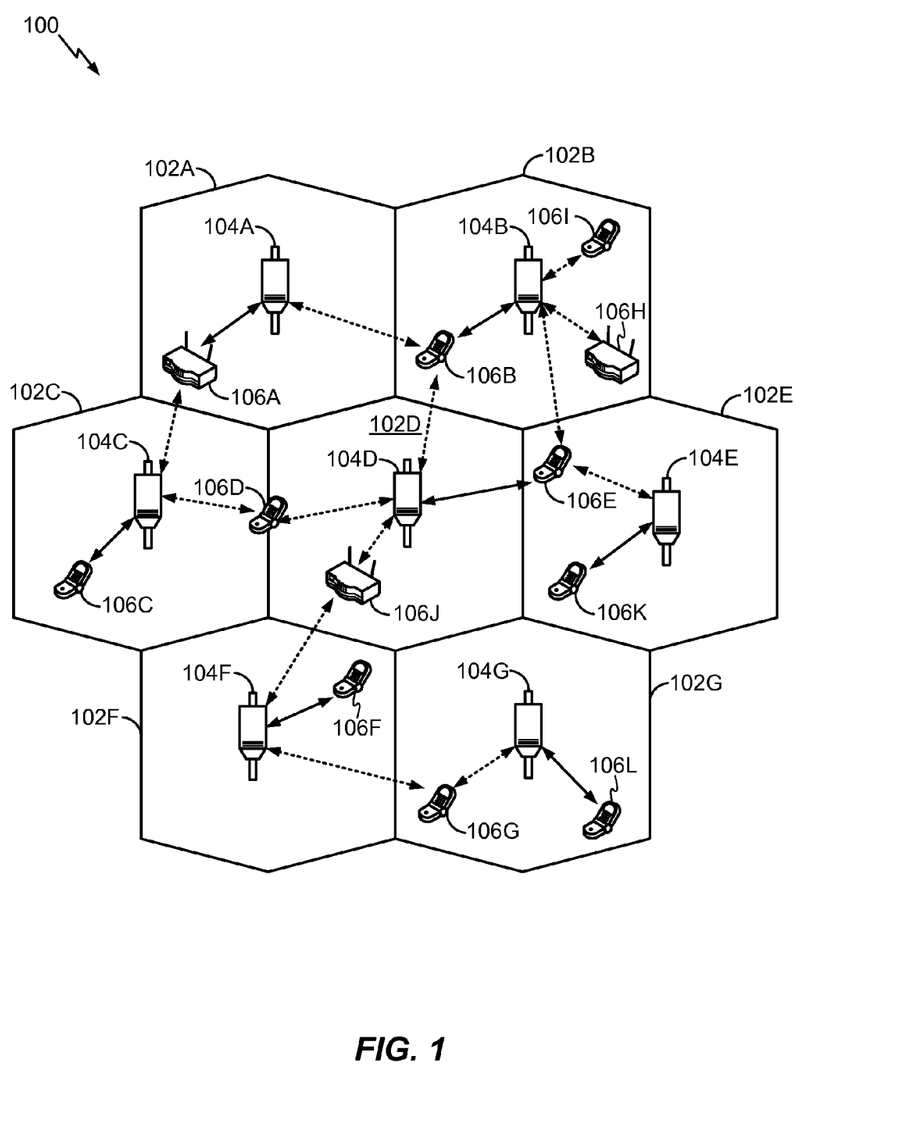
FIG. 1 depicts an exemplary functional block diagram of an exemplary wireless communication network.

FIG. 1 depicts an exemplary wireless communication network 100. The wireless communication network 100 is configured to support multiple access communication between multiple users. As shown, the wireless communication network 100 can be divided into one or more cells 102A-102G. One or more access points 104A-104G provide communication coverage in corresponding cells 102A-102G. The access points 104A-104G can interact with at least one user device in a plurality of user devices 106A-106L.

Each user device 106A-106L can communicate with one or more of the access points 104A-104G via a downlink (DL) and/or an uplink (UL). In general, a DL is a communication link from an access point to a user device, while an UL is a communication link from a user device to an access point. The access points 104A-104G can be coupled to each other and/or other network equipment via wired or wireless interfaces, allowing the access points 104A-104G to communicate with each other and/or the other network equipment. Accordingly, each user device 106A-106L can also communicate with another user device 106A-106L via one or more of the access points 104A-104G. For example, the user device 106J can communicate with the user device 106H in the following manner: the user device 106J can communicate with the access point 104D, the access point 104D can communicate with the access point 104B, and the access point 104B can communicate with the user device 106H, allowing communication to be established between the user device 106J and the user device 106H.

A wireless communication network, such as the wireless communication network 100, can provide service over a geographic region ranging from small to large. For example, the cells 102A-102G can cover a few blocks within a neighborhood or several square miles in a rural environment. In some systems, each of the cells 102A-102G can be further divided into one or more sectors (not shown in FIG. 1). In addition, the access points 104A-104G can provide the user devices 106A-106L within their respective coverage areas (i.e., respective cells 102A-102G) with access to other communication networks, such as at least one of the Internet, a cellular network, a private network, and the like. In the example shown in FIG. 1, the user devices 106A, 106H, and 106J comprise routers, while the user devices 106B-106G, 106I, 106K, and 106L comprise mobile devices. However, each of the user devices 106A-106L can comprise any suitable communication device.

At least a portion of the apparatus disclosed herein can be a part of at least one of the user devices 106A-106L. Further, at least a portion of the methods disclosed herein can be performed by at least one of the user devices 106A-106L. Further, embodiments of the disclosure can be practicably employed in a device that can be hand-held and include an electric circuit (e.g., an IC).

Figure 2:
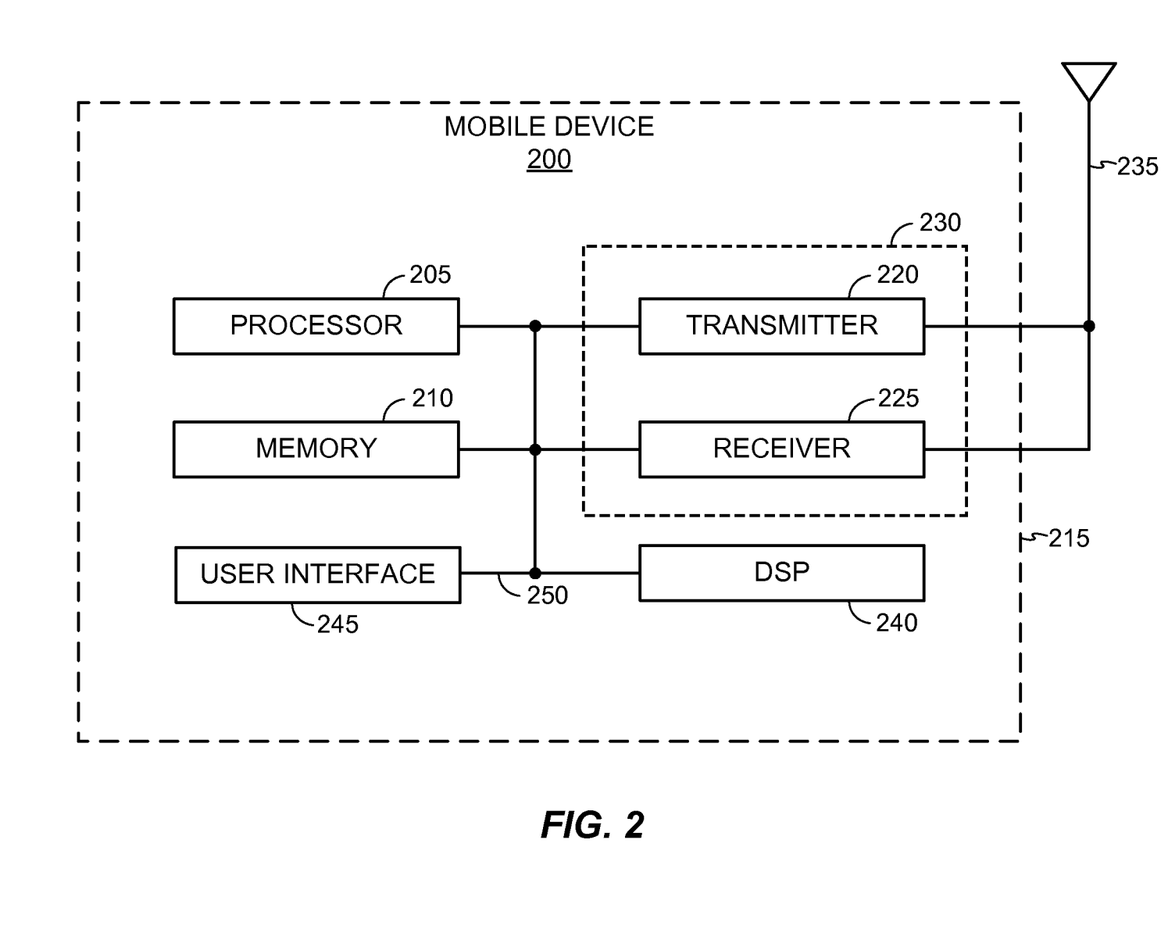
FIG. 2 depicts an exemplary functional block diagram of an exemplary mobile device.

FIG. 2 depicts an exemplary functional block diagram of an exemplary mobile device 200, which can correspond to at least one of the user devices 106A-106L, an exemplary device 500 (in FIG. 5) (e.g., a mobile device), or a combination thereof. FIG. 2 also depicts different components that can a part of the mobile device 200. The mobile device 200 is an example of a device that can be configured to include at least a portion of the apparatus described herein.

The mobile device 200 can include a processor 205 which is configured to control operation of at least a part of the mobile device 200, including performing at least a part of a method described herein. The processor 205 can also be referred to as a central processing unit (CPU), a special-purpose processor, or both. A memory 210, which can include at least one of read-only memory (ROM) and random access memory (RAM) provides at least one of instructions and data to the processor 205. The processor 205 can perform logical and arithmetic operations based on processor-executable instructions stored within the memory 210. The instructions stored in the memory 210 can be executed by the processor 205 to implement at least a part of a method described herein, such as instructions configured to control operating a synthetic jet.

The processor 205 can comprise, or be, a component of a processing system implemented with one or more processors. The one or more processors can be implemented with a microprocessor, a microcontroller, a digital signal processor (DSP), a field programmable gate array (FPGA), a programmable logic device (PLD), an application-specific integrated circuit (ASIC), a controller, a non-generic special-purpose processor, a state machine, gated logic, a discrete hardware component, a dedicated hardware finite state machine, any other suitable entity that can at least one of manipulate information (e.g., calculating, logical operations, and the like) and control another device, or a combination thereof. The processing system can also include a non-transitory machine-readable media (e.g., the memory 210) that stores software. Software can mean any type of instructions, whether referred to as at least one of software, firmware, middleware, microcode, hardware description language, and the like. Instructions can include code (e.g., in source code format, binary code format, executable code format, or any other suitable code format). The instructions are processor-executable and are configured to perform at least a portion of a method described hereby. The instructions, when executed by the processor 205, can transform the processor 205 into a special-purpose processor (e.g., an application-specific processor) that causes the processor 205 to perform at least a part of a function described hereby.

The mobile device 200 can also include a case 215, a transmitter 220, and a receiver 225 to allow transmitting and receiving information between the mobile device 200 and a remote location. The transmitter 220 and the receiver 225 can be combined into a transceiver 230. An antenna 235 can be attached to the case 215 and electrically coupled to the transceiver 230. The mobile device 200 can also include (not shown in FIG. 2) multiple transmitters, multiple receivers, multiple transceivers, and/or multiple antennas.

The mobile device 200 can further comprise a DSP 240 that is configured to process information. The mobile device 200 can also further comprise a user interface 245. The user interface 245 can comprise a keypad, a microphone, a speaker, a display, or a combination thereof. The user interface 245 can include a component that at least one of conveys information to a user of the mobile device 200 and receives information from the user.

The components of the mobile device 200 can be coupled together by a bus system 250. The bus system 250 can include at least one of a data bus, a power bus, a control signal bus, a status signal bus, and the like. The components of the mobile device 200 can be coupled together to communicate with each other using a different suitable mechanism.

Figure 3A:
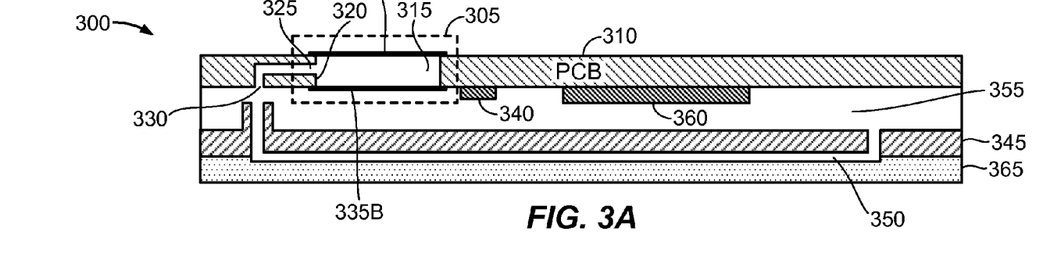
FIGS. 3A-3C depict views of an exemplary device.
Figure 3B:
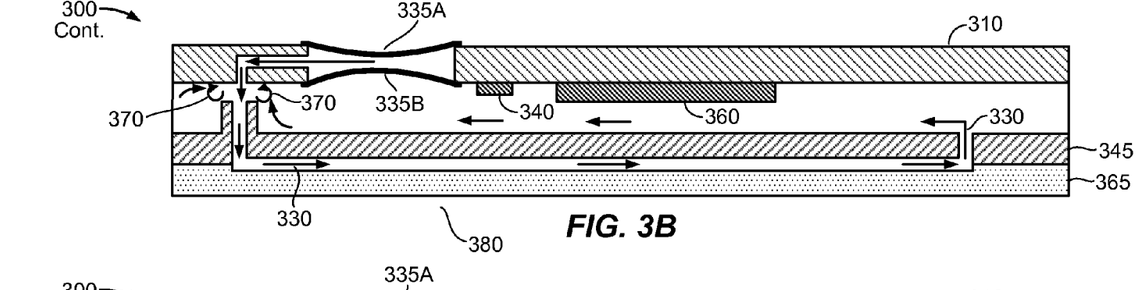
Figure 3C:
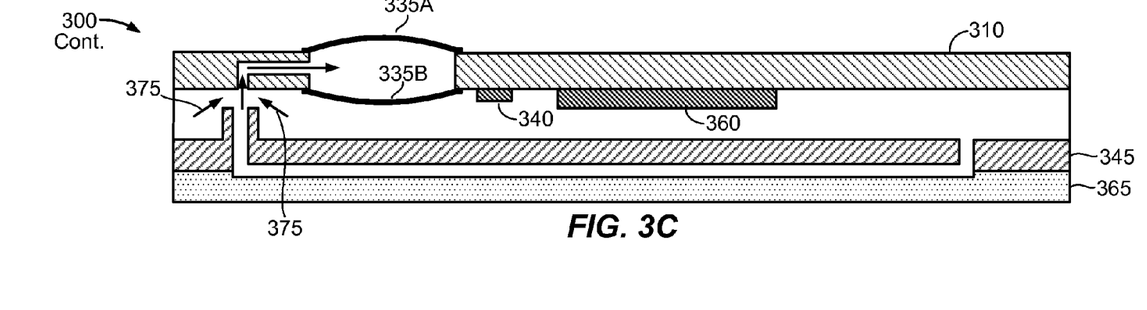

FIGS. 3A-3C depict views of an exemplary device 300, which can correspond to the user devices 106A-106L, the mobile device 200, the device 500 (in FIG. 5), or a combination thereof. FIGS. 3A-3C also depict different components that can comprise a part of the device 300. FIG. 3A depicts the device 300 in a static (e.g., "off") state, and FIGS. 3B-3C depict the device 300 in an exemplary operating state.

FIG. 3A depicts that the exemplary device 300 comprises a synthetic jet 305. The synthetic jet 305 can be a zero-net, mass-flux actuator that is capable of blowing fluid through a high-velocity through a port. The synthetic jet 305 can produce a quasi-steady flow of moving fluid in a thermal management system to move the fluid from a relatively hot region to a relatively cold region.

The exemplary device 300 comprises a circuit board 310 that defines at least a part of a chamber 315. Using the circuit board 310 as a portion of the synthetic jet 305 reduces a need to increase a thickness of the device 300 when implementing the synthetic jet 305. In FIG. 3A, the circuit board 310 is depicted as defining the chamber 315 with at least one rigid wall 320. The circuit board 310 can define the chamber 315 to have any practicable shape. The rigid wall 320 defines at least one orifice 325 that is open to the chamber 315. The rigid wall 320 can define the orifice 325 to have any practicable shape. The orifice 325 couples the chamber 315 to an environment outside of the chamber 315. In an example, only the orifice 325 couples the chamber 315 to an environment outside of the chamber 315. The chamber 315, the orifice 325, and the environment outside of the chamber 315 can hold a fluid 330.

The chamber 315 is also defined by at least one flexible diaphragm, such as a first flexible diaphragm 335A and a second flexible diaphragm 335B, that can flex, relative to the chamber 315, inwardly, outwardly, or a combination thereof. The first and second flexible diaphragms 335A, 335B can be sealed to the rigid wall 320 so that the chamber 315 is gas-tight with an exception of the orifice 325. Though two flexible diaphragms are depicted in FIGS. 3A-3C, in an example, the exemplary device 300 may comprise one flexible diaphragm (e.g., see FIGS. 6A-6C) or more than two flexible diaphragms. Using multiple flexible diaphragms can increase the efficiency of the synthetic jet 305, and can increase a volume of the fluid 330 which the synthetic jet 305 can move, relative to using a single flexible diaphragm. The first and second flexible diaphragms 335A, 335B can be moved in a controlled manner by a control system 340, such as a processor (e.g., the processor 205), an application-specific integrated circuit (ASIC), a signal generator, and the like. The control system 340 can be coupled to at least one electromechanical actuator (e.g., a piezoelectric device) that is mechanically coupled to a respective diaphragm, such as first and second flexible diaphragms 335A, 335B. Thus, an output from the control system 340 that is input to the electromechanical actuator can cause at least one of first and second flexible diaphragms 335A, 335B to flex, relative to the chamber 315, inwardly, outwardly, or a combination thereof. At least one of first and second flexible diaphragms 335A, 335B can be an integral part of a respective electromechanical actuator. The control system 340 can be configured to cause at least one of first and second flexible diaphragms 335A, 335B to flex in a periodic manner or a non-periodic manner.

The synthetic jet 305 can comprise a combination of the chamber 315, the rigid wall 320, the orifice 325, first flexible diaphragm 335A, the second flexible diaphragm 335B, and at least one electromechanical actuator. In an example, the device 300 can include multiple synthetic jets 305 configured to transfer heat within the device 300.

FIG. 3A also depicts that the exemplary device 300 comprises a midframe 345 that defines at least a part of at least one channel 350. The channel 350 can partially hold the fluid 330. The midframe 345 can define the channel 350 to have any practicable shape. The channel 350 can be oriented such that an axis of the channel 350 is substantially colinear with an axis of the orifice 325. The channel 350 can be oriented such that the fluid 330 can enter the channel 350 after exiting the orifice 325. The channel 350 can also be configured to direct a flow of the fluid 330. The channel 350 can be oriented such that the fluid 330 can enter, and subsequently exit, the channel 350. The channel 350 can also be configured to direct flow of the fluid 330 into at least a part of a cavity 355.

The cavity 355 can be defined at least in part by the circuit board 310, the midframe 345, or a combination thereof. The cavity 355 can be defined to have any practicable shape. A heat-generating integrated circuit 360 can be located completely in the cavity 355, partially inside the cavity 355, adjacent the cavity 355, or a practicable combination thereof. The integrated circuit 360 can be mounted on a surface of the circuit board 310. The circuit board 310 can also define a circuit board channel, on a surface of the circuit board 310, which is configured to transfer heat from the circuit board 310 to the fluid 330. The circuit board 310 can also define the circuit board channel to direct flow of the fluid 330, such as through the cavity 355.

The device 300 also includes a case 365 (e.g., housing) that at least partially defines at least a part of the channel 350. The case 365 can have an integral heat spreader located on at least a portion of an interior surface of the case 365, located on at least a portion of an exterior surface of the case 365, located at least partially within the case 365, or a combination thereof. In an example, the heat spreader is a graphite sheet. The heat spreader can have any practicable geometry.

FIGS. 3B-3C depict the device 300 in an operating state. FIG. 3B depicts the first and second flexible diaphragms 335A, 335B as being controlled to flex inward into the chamber 315. As a result of the inward flexing of the first and second flexible diaphragms 335A, 335B, a volume of the chamber 315 is reduced and the fluid 330 within the chamber 315 is ejected through the orifice 325. As the fluid 330 exits the orifice 325, vortices 370 are created in the fluid 330. The vortices 370 move away from the orifice 325 toward the channel 350. As the vortices 370 move away from the orifice 325, the vortices increase in size and entrain more of the fluid 330 from the cavity 355. At least one of the fluid 330 exiting the orifice 325, the fluid 330 entrained by the vortices 370 exiting the orifice 325, and a combination thereof, can be heated. The heating of the fluid 330 can result from the fluid 330 flowing adjacent to a surface of the circuit board 310, flowing adjacent to a surface of the heat-generating integrated circuit 360, flowing adjacent to a component mounted on the circuit board 310, flowing adjacent to a heat spreader, flowing adjacent to a heatsink, or a combination thereof. The fluid 330, now heated, is thus forced into the channel 350, and flows through the channel 350. As the fluid 330 flows through the channel 350, heat is transferred, via convection, from the fluid 330 to the case 365, thus cooling the fluid 330. The heat transferred to the case 365 is dissipated to an atmosphere 380 adjacent to the exterior of the case 365. The fluid 330, now cooled, is discharged from the channel 350 into the cavity 355. The fluid 330, now cooled, can flow through the cavity 355 and can be heated again.

The heating of the fluid 330, the cooling of the fluid 330, and the flow of the fluid 330 transfers heat energy from the integrated circuit 360 to the case 365 in a controlled manner, when compared to conventional techniques. The heating of the fluid 330, the cooling of the fluid 330, and the flow of the fluid 330 can also transfer the heat energy to a larger surface of the case 365, when compared to conventional techniques.

FIG. 3C depicts the first and second flexible diaphragms 335A, 335B as being controlled to flex outward from the chamber 315. As a result of the outward flexing of the first and second flexible diaphragms 335A, 335B, the volume of the chamber 315 is increased and the fluid 330 is sucked 375 from the cavity 355, through the orifice 325, and into the chamber 315. The outward flexing of the first and second flexible diaphragms 335A, 335B does not substantially affect the vortices 370, as the vortices 370 have moved away from the orifice 325 by the time the fluid 330 is sucked 375 into the chamber 315 from the cavity 355. After the fluid 330 is sucked 375 into the chamber 315 from the cavity 355, the first and second flexible diaphragms 335A, 335B can be flexed inward as described in relation to FIG. 3B, thus providing a pumping action by the synthetic jet 305.

Figure 4:
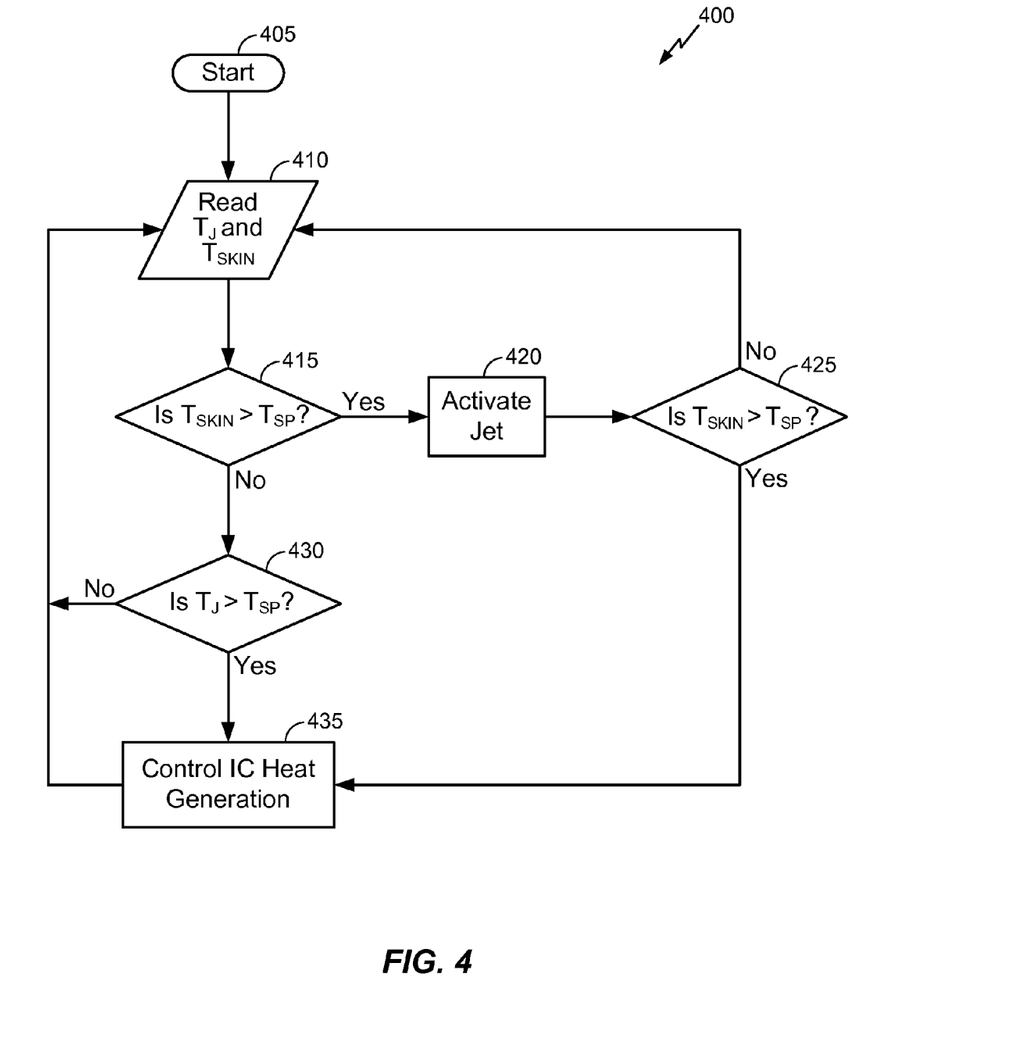
FIG. 4 depicts an exemplary method for controlling a synthetic jet.

FIG. 4 depicts an exemplary method 400 for controlling a synthetic jet. The method 400 for controlling a synthetic jet can be performed at least in part by the apparatus described hereby, such as at least one of the user devices 106A-106L, the mobile device 200, or a combination thereof. The method 400 can be performed at least in part by a processor, such as the processor 205, a processor 505 (in FIG. 5), and the like.

In block 405, the method starts. The method 400 then proceeds to block 410.

In block 410, junction temperature ($T_J$) data indicating a junction temperature is received. The junction temperature data indicates a junction temperature of at least one integrated circuit (IC) located in a case. Also received is case temperature ($T_{SKIN}$) data indicating a case temperature. The case temperature data indicates at least one skin temperature of the case. The method 400 then proceeds to block 415. In examples, the case temperature data can indicate the skin temperature of the exterior of the case, the interior of the case, a portion of the case that defines a channel through which the synthetic jet is configured to pass fluid, or a combination thereof.

In block 415, it is determined if the skin temperature is greater than a skin temperature threshold ($T_{SP}$). If the skin temperature is greater than the skin temperature threshold, then the method 400 proceeds to block 420. If the skin temperature is not greater than the skin temperature threshold, then the method 400 proceeds to block 430.

In block 420, the synthetic jet is actuated. The actuation can include applying a control input to the synthetic jet. The control input to the synthetic jet can include at least one of a control current (e.g., AC control current, DC control current), a control voltage (e.g., AC control voltage, DC control voltage), or a combination thereof. In an example, the control input to the synthetic jet can include a periodically-varying voltage (e.g., a modulating voltage) having a substantially-specific frequency that is variable to control the pumping action of the synthetic jet. The method 400 then proceeds to block 425.

In block 425, it is determined if the skin temperature is greater than the skin temperature threshold ($T_{SP}$). If the skin temperature is greater than the skin temperature threshold, then the method 400 proceeds to block 435. If the skin temperature is not greater than the skin temperature threshold, then the method 400 proceeds to block 410.

In block 430, it is determined if the junction temperature is greater than the junction temperature threshold. If the junction temperature is greater than the junction temperature threshold, then the method 400 proceeds to block 435. If the junction temperature is not greater than the junction temperature threshold, then the method 400 proceeds to block 410.

In block 435, heat generation of the IC is controlled (e.g., reduced) by varying an electrical characteristic of the IC. For example, a frequency of a clock applied in the IC is reduced to reduce heat generation of the IC. Reducing the clock frequency reduces the computation rate of the integrated circuit, which in turn lowers the heat generated by the integrated circuit. In another example, a voltage applied in the IC is reduced to reduce heat generation of the IC.

In an example, the heat generation of the IC can be controlled by a dynamic voltage and clock scaling (DVCS) control system. The DVCS system: 1.) can reduce the IC's power consumption, and thus reduce the IC's heat output, by scaling a supply voltage applied in the IC; 2.) can scale a clock frequency applied in the IC; or 3.) a combination thereof. In an example, an adaptive DVCS method can balance power consumption (and heat generation by the IC) with an IC performance level. This balance can be based at least in part on retrieved stored data describing: 1.) IC performance (e.g., at a specific heat generating level) that is known, measured, predicted, or a combination thereof; 2.) IC heat output (e.g., at a specific IC performance level) that is known, measured, predicted, or a combination thereof; 3.) an IC performance model; or 4.) a combination thereof. The adaptive DVCS method can be performed at least in part by a processor, such as the processor 205, the processor 505 (in FIG. 5), and the like.

The foregoing steps are not limiting of the examples. The steps can be combined and/or the order can be rearranged, as practicable.

Figure 5:
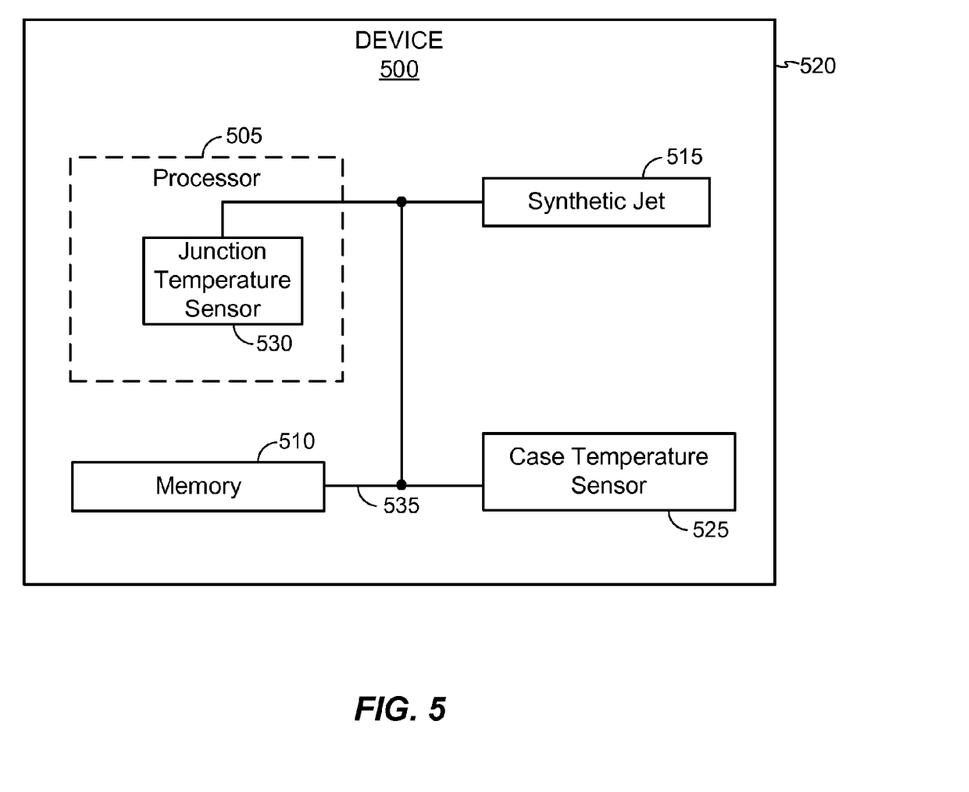
FIG. 5 depicts an exemplary functional block diagram of an exemplary mobile device.

FIG. 5 depicts an exemplary functional block diagram of the device 500, which can correspond to at least one of the user devices 106A-106L, the mobile device 200, or a combination thereof. FIG. 5 also depicts different components that can a part of the device 500. The device 500 is an example of a device that can be configured to control a synthetic jet as described herein.

The device 500 can include the processor 505 which is configured to control operation of at least a part of the device 500, which can include performing at least a part of a method described herein. The processor 505 can also be referred to as a central processing unit (CPU), a special-purpose processor, or both. In an example, the processor 505 is a coprocessor that can be configured to operate with an additional processor (e.g., a main processor, the processor 205, and the like). In an example, the processor 505 is the processor 205.

A memory 510, which can include at least one of ROM and RAM provides at least one of instructions and data to the processor 505. In an example, the memory 510 is an integral part of the processor 505. The processor 505 can perform logical and arithmetic operations based on processor-executable instructions stored within the memory 510. The instructions stored in the memory 510 can be executed to implement at least a part of a method described herein. The memory 510 can store instructions to control operating a synthetic jet. Thus, the instructions stored in the memory 510, when executed by the processor 505, can cause the processor 505 to control operation of a synthetic jet 515. In an example, the instructions can cause the processor 505 to perform the functions of a DVCS system.

The processor 505 can comprise or be a component of a processing system implemented with one or more processors. The one or more processors can be implemented with a microprocessor, a microcontroller, a DSP, an FPGA, a PLD, an ASIC, a controller, a non-generic special-purpose processor, a state machine, gated logic, a discrete hardware component, a dedicated hardware finite state machine, and any other suitable entity that can at least one of manipulate information (e.g., calculating, logical operations, and the like) and control another device, or a combination thereof. The processing system can also include a non-transitory machine-readable media (e.g., the memory 510) that stores software. Software can mean any type of instructions, whether referred to as at least one of software, firmware, middleware, microcode, hardware description language, and the like. Instructions can include code (e.g., in source code format, binary code format, executable code format, or any other suitable code format). The instructions are processor-executable and are configured to perform at least a portion of a method described hereby. The instructions, when executed by the processor 505, can transform the processor 505 into a special-purpose processor (e.g., an application-specific processor) that causes the processor to perform at least a part of a function described hereby.

The device 500 can also include a case 520 (e.g., a housing, a device case). The case 520 can be configured to include the case features as described herein (e.g., as described with reference to FIG. 3).

At least one case temperature sensor 525 can be mechanically coupled to an exterior surface of the case 520, an interior surface of the case 520, a portion of the case 520 that defines a channel through which the synthetic jet 515 is configured to pass fluid, or a combination thereof. An exemplary case temperature sensor 525 can include a thermistor, a resistance temperature sensor, a thermocouple, a silicon bandgap temperature sensor, and the like. The case temperature sensor 525 generates data describing a temperature of an exterior surface of the case 520, a temperature of an interior surface of the case 520, a temperature of a portion of the case 520 that defines a channel through which the synthetic jet 515 is configured to pass fluid, or a combination thereof.

At least one junction temperature sensor 530 can be mechanically coupled to an exterior surface of the processor 505, an interior portion of the processor 505, or a combination thereof. An exemplary junction temperature sensor 530 can include a thermistor, a resistance temperature sensor, a thermocouple, a silicon bandgap temperature sensor, and the like. The junction temperature sensor 530 generates data describing a temperature of an exterior surface of the processor 505, an interior portion of the processor 505, or a combination thereof.

The components of the device 500 can be coupled together by a bus system 535. The bus system 535 can include at least one of a data bus, a power bus, a control signal bus, a status signal bus, and the like. The components of the device 500 can be coupled together to communicate with each other using a different suitable mechanism.

Figure 6A:
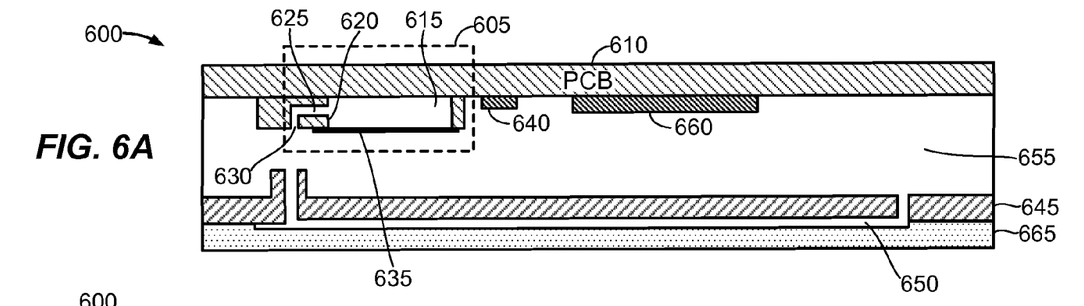
FIGS. 6A-6C depict views of another exemplary device.
Figure 6B:
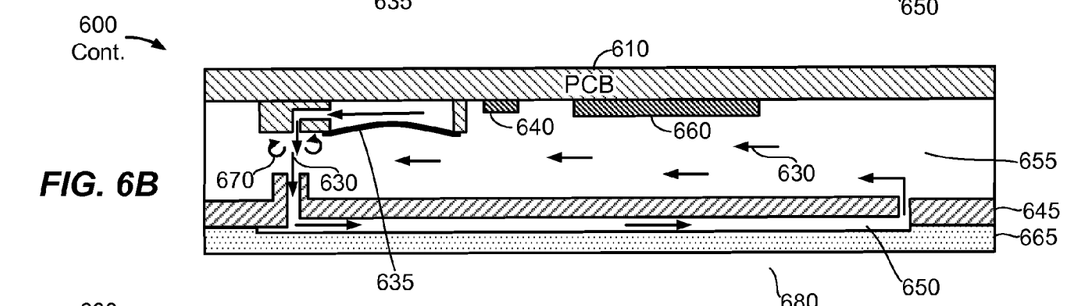
Figure 6C:
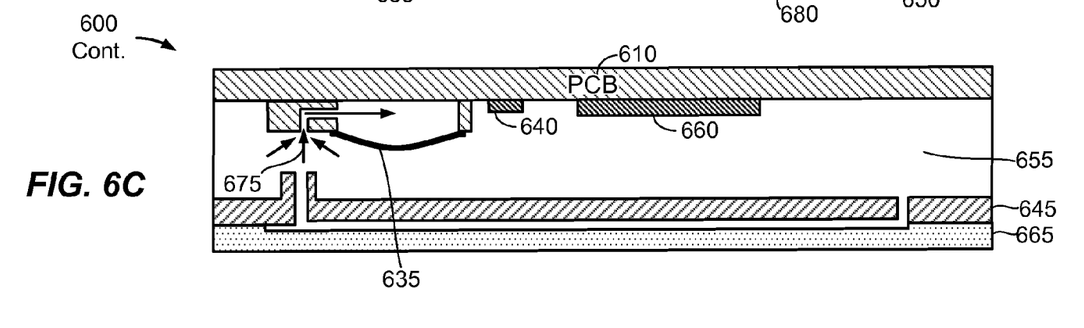

FIGS. 6A-6C depict views of an exemplary device 600, which can correspond to the user devices 106A-106L, the mobile device 200, the device 500, or a combination thereof. FIGS. 6A-6C also depict different components that can comprise a part of the device 600. FIG. 6A depicts the device 600 in a static (e.g., "off") state, and FIGS. 6B-6C depict the device 600 in an exemplary operating state.

FIG. 6A depicts that the exemplary device 600 comprises a synthetic jet 605. The synthetic jet 605 can be a zero-net, mass-flux actuator that is capable of blowing fluid through a high-velocity through a port. The synthetic jet 605 can produce a quasi-steady flow of moving fluid in a thermal management system to move the fluid from a relatively hot region to a relatively cold region.

The exemplary device 600 comprises a circuit board 610 that defines at least a part of a chamber 615. Using the circuit board 610 as a portion of the synthetic jet 605 reduces a need to increase a thickness of the device 600 when implementing the synthetic jet 605. In FIG. 6A, the circuit board 610 is depicted as defining the chamber 615 with at least one rigid wall 620. The circuit board 610 can define the chamber 615 to have any practicable shape. The rigid wall 620 defines at least one orifice 625 that is open to the chamber 615. The rigid wall 620 can define the orifice 625 to have any practicable shape. The orifice 625 couples the chamber 615 to an environment outside of the chamber 615. In an example, only the orifice 625 couples the chamber 615 to an environment outside of the chamber 615. The chamber 615, the orifice 625, and the environment outside of the chamber 615 can hold a fluid 630.

The chamber 615 is also defined by at least one flexible diaphragm, such as a flexible diaphragm 635, that can flex, relative to the chamber 615, inwardly, outwardly, or a combination thereof. The flexible diaphragm 635 can be sealed to the rigid wall 620 so that the chamber 615 is gas-tight with an exception of the orifice 625. The rigid wall 620 can extend a mounting point of the flexible diaphragm 635 away from the circuit board 610, in order to increase the volume of the chamber 615 relative to if the flexible diaphragm 635 was mounted directly to the circuit board 610. The flexible diaphragm 635 can be moved in a controlled manner by a control system 640, such as a processor (e.g., the processor 205), an application-specific integrated circuit (ASIC), a signal generator, and the like. The control system 640 can be coupled to at least one electromechanical actuator (e.g., a piezoelectric device) that is mechanically coupled to a respective diaphragm, such as the flexible diaphragm 635. Thus, an output from the control system 640 that is input to the electromechanical actuator can cause at least one of the flexible diaphragm 635 to flex, relative to the chamber 615, inwardly, outwardly, or a combination thereof. The flexible diaphragm 635 can be an integral part of a respective electromechanical actuator. The control system 640 can be configured to cause the flexible diaphragms 635 to flex in a periodic manner or a non-periodic manner.

The synthetic jet 605 can comprise a combination of the chamber 615, the rigid wall 620, the orifice 625, the flexible diaphragm 635, and at least one electromechanical actuator. In an example, the device 600 can include multiple synthetic jets 605 configured to transfer heat within the device 600.

FIG. 6A also depicts that the exemplary device 600 comprises a midframe 645 that defines at least a part of at least one channel 650. The channel 650 can partially hold the fluid 630. The midframe 645 can define the channel 650 to have any practicable shape. The channel 650 can be oriented such that an axis of the channel 650 is substantially colinear with an axis of the orifice 625. The channel 650 can be oriented such that the fluid 630 can enter the channel 650 after exiting the orifice 625. The channel 650 can also be configured to direct a flow of the fluid 630. The channel 650 can be oriented such that the fluid 630 can enter, and subsequently exit, the channel 650. The channel 650 can also be configured to direct flow of the fluid 630 into at least a part of a cavity 655.

The cavity 655 can be defined at least in part by the circuit board 610, the midframe 645, or a combination thereof. The cavity 655 can be defined to have any practicable shape. A heat-generating integrated circuit 660 can be located completely in the cavity 655, partially inside the cavity 655, adjacent the cavity 655, or a practicable combination thereof. The integrated circuit 660 can be mounted on a surface of the circuit board 610. The circuit board 610 can also define a circuit board channel, on a surface of the circuit board 610, which is configured to transfer heat from the circuit board 610 to the fluid 630. The circuit board 610 can also define the circuit board channel to direct flow of the fluid 630, such as through the cavity 655.

The device 600 also includes a case 665 (e.g., housing) that at least partially defines at least a part of the channel 650. The case 665 can have an integral heat spreader located on at least a portion of an interior surface of the case 665, located on at least a portion of an exterior surface of the case 665, located at least partially within the case 665, or a combination thereof. In an example, the heat spreader is a graphite sheet. The heat spreader can have any practicable geometry.

FIGS. 6B-6C depict the device 600 in an operating state. FIG. 6B depicts the flexible diaphragm 635 as being controlled to flex inward into the chamber 615. As a result of the inward flexing of the flexible diaphragm 635, a volume of the chamber 615 is reduced and the fluid 630 within the chamber 615 is ejected through the orifice 625. As the fluid 630 exits the orifice 625, vortices 670 are created in the fluid 630. The vortices 670 move away from the orifice 625 toward the channel 650. As the vortices 670 move away from the orifice 625, the vortices increase in size and entrain more of the fluid 630 from the cavity 655. At least one of the fluid 630 exiting the orifice 625, the fluid 630 entrained by the vortices 670 exiting the orifice 625, and a combination thereof, can be heated. The heating of the fluid 630 can result from the fluid 630 flowing adjacent to a surface of the circuit board 610, flowing adjacent to a surface of the heat-generating integrated circuit 660, flowing adjacent to a component mounted on the circuit board 610, flowing adjacent to a heat spreader, flowing adjacent to a heatsink, or a combination thereof. The fluid 630, now heated, is thus forced into the channel 650, and flows through the channel 650. As the fluid 630 flows through the channel 650, heat is transferred, via convection, from the fluid 630 to the case 665, thus cooling the fluid 630. The heat transferred to the case 665 is dissipated to an atmosphere 680 adjacent to the exterior of the case 665. The fluid 630, now cooled, is discharged from the channel 650 into the cavity 655. The fluid 630, now cooled, can flow through the cavity 655 and can be heated again.

The heating of the fluid 630, the cooling of the fluid 630, and the flow of the fluid 630 transfers heat energy from the integrated circuit 660 to the case 665 in a controlled manner, when compared to conventional techniques. The heating of the fluid 630, the cooling of the fluid 630, and the flow of the fluid 630 can also transfer the heat energy to a larger surface of the case 665, when compared to conventional techniques.

FIG. 6C depicts the flexible diaphragm 635 as being controlled to flex outward from the chamber 615. As a result of the outward flexing of the flexible diaphragm 635, the volume of the chamber 615 is increased and the fluid 630 is sucked 675 from the cavity 655, through the orifice 625, and into the chamber 615. The outward flexing of the flexible diaphragm 635 does not substantially affect the vortices 670, as the vortices 670 have moved away from the orifice 625 by the time the fluid 630 is sucked 675 into the chamber 615 from the cavity 655. After the fluid 630 is sucked 675 into the chamber 615 from the cavity 655, the flexible diaphragm 635 can be flexed inward as described in relation to FIG. 6B, thus providing a pumping action by the synthetic jet 605.

Figure 7A:
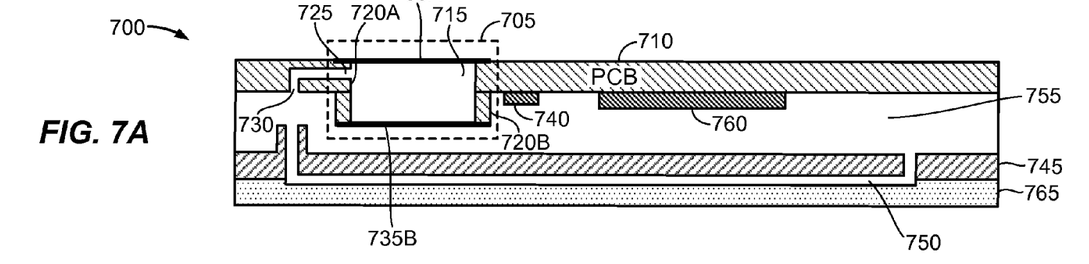
FIGS. 7A-7C depict views of another exemplary device.
Figure 7B:
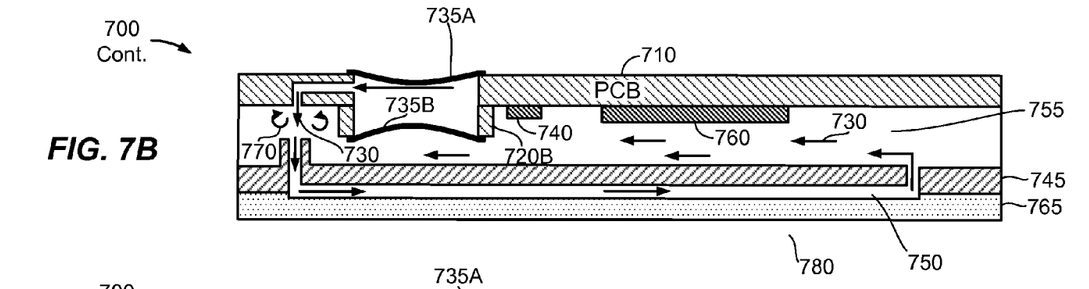
Figure 7C:
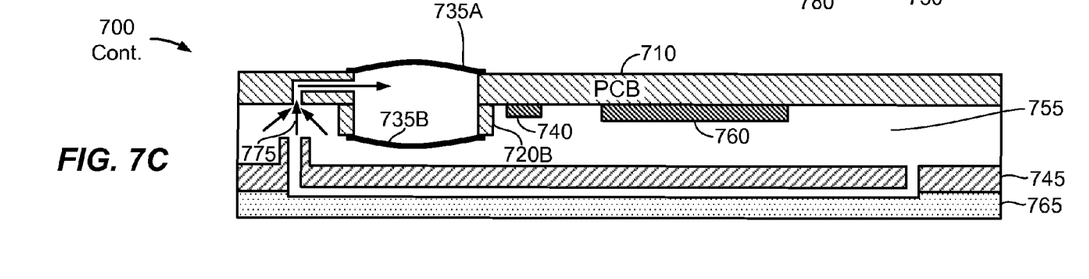

FIGS. 7A-7C depict views of an exemplary device 700, which can correspond to the user devices 106A-106L, the mobile device 200, the device 500, or a combination thereof. FIGS. 7A-7C also depict different components that can comprise a part of the device 700. FIG. 7A depicts the device 700 in a static (e.g., "off") state, and FIGS. 7B-7C depict the device 700 in an exemplary operating state.

FIG. 7A depicts that the exemplary device 700 comprises a synthetic jet 705. The synthetic jet 705 can be a zero-net, mass-flux actuator that is capable of blowing fluid through a high-velocity through a port. The synthetic jet 705 can produce a quasi-steady flow of moving fluid in a thermal management system to move the fluid from a relatively hot region to a relatively cold region.

The exemplary device 700 comprises a circuit board 710 that defines at least a part of a chamber 715. Using the circuit board 710 as a portion of the synthetic jet 705 reduces a need to increase a thickness of the device 700 when implementing the synthetic jet 705. In FIG. 7A, the circuit board 710 is depicted as defining the chamber 715 with first and second rigid walls 720A, 720B. The circuit board 710 can define the chamber 715 to have any practicable shape. The first and second rigid walls 720A, 720B define at least one orifice 725 that is open to the chamber 715. At least one of the first and second rigid walls 720A, 720B can define the orifice 725 to have any practicable shape. In an example, at least one of the first and second rigid walls 720A, 720B are an integral part of the circuit board 710. In an example, at least one of the first and second rigid walls 720A, 720B are not an integral part of the circuit board 710, and are a separate component that is mounted on, and gas-tight sealed to, the circuit board 710. The orifice 725 couples the chamber 715 to an environment outside of the chamber 715. In an example, only the orifice 725 couples the chamber 715 to an environment outside of the chamber 715. The chamber 715, the orifice 725, and the environment outside of the chamber 715 can hold a fluid 730.

The chamber 715 is also defined by at least one flexible diaphragm, such as a first flexible diaphragm 735A and a second flexible diaphragm 735B, that can flex, relative to the chamber 715, inwardly, outwardly, or a combination thereof. At least one of the first and second flexible diaphragms 735A, 735B can be sealed to the first and second rigid walls 720A, 720B so that the chamber 715 is gas-tight with an exception of the orifice 725. Though two flexible diaphragms are depicted in FIGS. 7A-7C, in an example, the exemplary device 700 may comprise more than two flexible diaphragms. Using multiple flexible diaphragms can increase the efficiency of the synthetic jet 705, and can increase a volume of the fluid 730 which the synthetic jet 705 can move, relative to using a single flexible diaphragm. The first and second flexible diaphragms 735A, 735B can be moved in a controlled manner by a control system 740, such as a processor (e.g., the processor 205), an application-specific integrated circuit (ASIC), a signal generator, and the like. The control system 740 can be coupled to at least one electromechanical actuator (e.g., a piezoelectric device) that is mechanically coupled to a respective diaphragm, such as first and second flexible diaphragms 735A, 735B. Thus, an output from the control system 740 that is input to the electromechanical actuator can cause at least one of first and second flexible diaphragms 735A, 735B to flex, relative to the chamber 715, inwardly, outwardly, or a combination thereof. At least one of first and second flexible diaphragms 735A, 735B can be an integral part of a respective electromechanical actuator. The control system 740 can be configured to cause at least one of first and second flexible diaphragms 735A, 735B to flex in a periodic manner or a non-periodic manner.

The synthetic jet 705 can comprise a combination of the chamber 715, the first and second rigid walls 720A, 720B, the orifice 725, first flexible diaphragm 735A, the second flexible diaphragm 735B, and at least one electromechanical actuator. In an example, the device 700 can include multiple synthetic jets 705 configured to transfer heat within the device 700.

FIG. 7A also depicts that the exemplary device 700 comprises a midframe 745 that defines at least a part of at least one channel 750. The channel 750 can partially hold the fluid 730. The midframe 745 can define the channel 750 to have any practicable shape. The channel 750 can be oriented such that an axis of the channel 750 is substantially colinear with an axis of the orifice 725. The channel 750 can be oriented such that the fluid 730 can enter the channel 750 after exiting the orifice 725. The channel 750 can also be configured to direct a flow of the fluid 730. The channel 750 can be oriented such that the fluid 730 can enter, and subsequently exit, the channel 750. The channel 750 can also be configured to direct flow of the fluid 730 into at least a part of a cavity 755.

The cavity 755 can be defined at least in part by the circuit board 710, the midframe 745, or a combination thereof. The cavity 755 can be defined to have any practicable shape. A heat-generating integrated circuit 760 can be located completely in the cavity 755, partially inside the cavity 755, adjacent the cavity 755, or a practicable combination thereof. The integrated circuit 760 can be mounted on a surface of the circuit board 710. The circuit board 710 can also define a circuit board channel, on a surface of the circuit board 710, which is configured to transfer heat from the circuit board 710 to the fluid 730. The circuit board 710 can also define the circuit board channel to direct flow of the fluid 730, such as through the cavity 755.

The device 700 also includes a case 765 (e.g., housing) that at least partially defines at least a part of the channel 750. The case 765 can have an integral heat spreader located on at least a portion of an interior surface of the case 765, located on at least a portion of an exterior surface of the case 765, located at least partially within the case 765, or a combination thereof. In an example, the heat spreader is a graphite sheet. The heat spreader can have any practicable geometry.

FIGS. 7B-7C depict the device 700 in an operating state. FIG. 7B depicts the first and second flexible diaphragms 735A, 735B as being controlled to flex inward into the chamber 715. As a result of the inward flexing of the first and second flexible diaphragms 735A, 735B, a volume of the chamber 715 is reduced and the fluid 730 within the chamber 715 is ejected through the orifice 725. As the fluid 730 exits the orifice 725, vortices 770 are created in the fluid 730. The vortices 770 move away from the orifice 725 toward the channel 750. As the vortices 770 move away from the orifice 725, the vortices increase in size and entrain more of the fluid 730 from the cavity 755. At least one of the fluid 730 exiting the orifice 725, the fluid 730 entrained by the vortices 770 exiting the orifice 725, and a combination thereof, can be heated. The heating of the fluid 730 can result from the fluid 730 flowing adjacent to a surface of the circuit board 710, flowing adjacent to a surface of the heat-generating integrated circuit 760, flowing adjacent to a component mounted on the circuit board 710, flowing adjacent to a heat spreader, flowing adjacent to a heatsink, or a combination thereof. The fluid 730, now heated, is thus forced into the channel 750, and flows through the channel 750. As the fluid 730 flows through the channel 750, heat is transferred, via convection, from the fluid 730 to the case 765, thus cooling the fluid 730. The heat transferred to the case 765 is dissipated to an atmosphere 780 adjacent to the exterior of the case 765. The fluid 730, now cooled, is discharged from the channel 750 into the cavity 755. The fluid 730, now cooled, can flow through the cavity 755 and can be heated again.

The heating of the fluid 730, the cooling of the fluid 730, and the flow of the fluid 730 transfers heat energy from the integrated circuit 760 to the case 765 in a controlled manner, when compared to conventional techniques. The heating of the fluid 730, the cooling of the fluid 730, and the flow of the fluid 730 can also transfer the heat energy to a larger surface of the case 765, when compared to conventional techniques.

FIG. 7C depicts the first and second flexible diaphragms 735A, 735B as being controlled to flex outward from the chamber 715. As a result of the outward flexing of the first and second flexible diaphragms 735A, 735B, the volume of the chamber 715 is increased and the fluid 730 is sucked 775 from the cavity 755, through the orifice 725, and into the chamber 715. The outward flexing of the first and second flexible diaphragms 735A, 735B does not substantially affect the vortices 770, as the vortices 770 have moved away from the orifice 725 by the time the fluid 730 is sucked 775 into the chamber 715 from the cavity 755. After the fluid 730 is sucked 775 into the chamber 715 from the cavity 755, the first and second flexible diaphragms 735A, 735B can be flexed inward as described in relation to FIG. 7B, thus providing a pumping action by the synthetic jet 705.

In an example, a device (e.g., the device 300, the device 600, the device 700, and the like) can include multiple synthetic jets (e.g., the synthetic jet 305, the synthetic jet 605, the synthetic jet 705, the like, or a combination thereof) configured to transfer heat within the device.

Further, those of skill in the art will appreciate that the exemplary logical blocks, modules, circuits, and steps described in the examples disclosed herein may be implemented as electronic hardware, computer software, or combinations of both, as practicable. To clearly illustrate this interchangeability of hardware and software, exemplary components, blocks, modules, circuits, and steps have been described herein generally in terms of their functionality. Whether such functionality is implemented as hardware or software depends upon the particular application and design constraints imposed on an overall system. Skilled artisans can implement the described functionality in different ways for each particular application, but such implementation decisions should not be interpreted as causing a departure from the scope of the present disclosure.

At least a portion of the methods, sequences, and/or algorithms described in connection with the examples disclosed herein can be embodied directly in hardware, in software executed by a processor (e.g., a processor described hereby), or in a combination of the two. In an example, a processor includes multiple discrete hardware components. A software module can reside in a storage medium (e.g., a memory device), such as a RAM, a flash memory, a ROM, an erasable programmable read-only memory (EPROM), an electrically erasable programmable read-only memory (EEPROM), a register, a hard disk, a removable disk, a compact disc read-only memory (CD-ROM), a Subscriber Identity Module (SIM) card, a Universal Subscriber Identity Module (USIM) card, and/or any other form of storage medium. An exemplary storage medium (e.g., a memory device) can be coupled to the processor such that the processor can read information from, and/or write information to, the storage medium. In an example, the storage medium can be integral with the processor.

Further, examples provided hereby are described in terms of sequences of actions to be performed by, for example, elements of a computing device. The actions described herein can be performed by a specific circuit (e.g., an ASIC), by program instructions being executed by one or more processors, or by a combination of both. Additionally, a sequence of actions described herein can be considered to be entirely within any form of computer readable storage medium having stored therein a corresponding set of computer instructions that, upon execution, would cause an associated processor (such as a special-purpose processor) to perform at least a portion of a function described herein. Thus, examples may be in a number of different forms, all of which have been contemplated to be within the scope of the disclosure. In addition, for each of the examples described herein, a corresponding electrical circuit of any such examples may be described herein as, for example, "logic configured to" perform a described action.

The disclosed devices and methods can be designed and can be configured into a computer-executable file that is in a Graphic Database System Two (GDSII) compatible format, an Open Artwork System Interchange Standard (OASIS) compatible format, and/or a GERBER (e.g., RS-274D, RS-274X, etc.) compatible format, which can be stored on a non-transitory (i.e., a non-transient) computer-readable media. The file can be provided to a fabrication handler who fabricates with a lithographic device, based on the file, an integrated device. Deposition of a material to form at least a portion of a structure described herein can be performed using deposition techniques such as physical vapor deposition (PVD, e.g., sputtering), plasma-enhanced chemical vapor deposition (PECVD), thermal chemical vapor deposition (thermal CVD), and/or spin-coating, and the like. Etching of a material to form at least a portion of a structure described herein can be performed using etching techniques such as plasma etching. In an example, the integrated device is on a semiconductor wafer. The semiconductor wafer can be cut into a semiconductor die and packaged into a semiconductor chip. The semiconductor chip can be employed in a device described herein (e.g., a mobile device, an access device, and/or the like).

At least one example provided hereby can include a non-transitory (i.e., a non-transient) machine-readable media and/or a non-transitory (i.e., a non-transient) computer-readable media storing processor-executable instructions configured to cause a processor (e.g., a special-purpose processor) to transform the processor and any other cooperating devices into a machine (e.g., a special-purpose processor) configured to perform at least a part of a function described hereby and/or a method described hereby. Performing at least a part of a function described hereby can include initiating at least a part of a function described hereby. In an example, execution of the stored instructions can transform a processor and any other cooperating devices into at least a part of an apparatus described hereby. A non-transitory (i.e., a non-transient) machine-readable media specifically excludes a transitory propagating signal. Further, at least one embodiment of the invention can include a computer readable media embodying at least a part of a method described herein. Accordingly, any means for performing the functions described herein are included in at least one embodiment of the invention. A non-transitory (i.e., a non-transient) machine-readable media specifically excludes a transitory propagating signal.

Nothing stated or depicted in this application is intended to dedicate any component, step, feature, object, benefit, advantage, or equivalent to the public, regardless of whether the component, step, feature, object, benefit, advantage, or the equivalent is recited in the claims.

While this disclosure describes examples, changes and modifications can be made to the examples disclosed herein without departing from the scope defined by the appended claims. The present disclosure is not intended to be limited to the specifically disclosed examples alone.

What is claimed is:

1. A mobile device, comprising:
   a synthetic jet embedded in a circuit board inside the mobile device, wherein the circuit board comprises:
      at least a portion of a chamber of the synthetic jet, and
      an orifice of the synthetic jet;
   a case of the mobile device in contact with at least one channel inside the mobile device; and
   an application-specific integrated circuit configured to receive a skin temperature of the case and actuate the synthetic jet to direct a fluid at the at least one channel from a synthetic jet outlet of the synthetic jet if the skin temperature is greater than a skin temperature threshold.

2. The mobile device of claim 1, further comprising a frame adjacent to the case of the mobile device, wherein the synthetic jet outlet is aimed at a cavity that is at least partially defined by the frame.

3. The mobile device of claim 1, further comprising:
   a frame adjacent to the case; and
   an integrated circuit,
   wherein:
      the circuit board and the frame define a cavity configured to direct the fluid adjacent to the integrated circuit, and
      the integrated circuit is located at least in part in at least a portion of the cavity.

4. The mobile device of claim 1, wherein the at least one channel is substantially coplanar with the circuit board.

5. The mobile device of claim 1, wherein the synthetic jet includes at least one piezoelectric diaphragm.

6. The mobile device of claim 1, wherein the application-specific integrated circuit is configured to actuate the synthetic jet by varying a frequency of an AC voltage applied to the synthetic jet.

7. A method for controlling a synthetic jet, comprising
   receiving case temperature data indicating a skin temperature of a case; and
   initiating, if the skin temperature is greater than a skin temperature threshold, applying a control voltage to actuate the synthetic jet.

8. The method of claim 7, further comprising reducing, if the skin temperature is greater than the skin temperature threshold, a clock frequency applied in an integrated circuit.

9. The method of claim 7, further comprising:
   receiving junction temperature data indicating a junction temperature of an integrated circuit located in the case; and
   reducing, if the junction temperature is greater than a junction temperature threshold, a clock frequency applied in the integrated circuit.

10. The method of claim 7, wherein the case temperature data indicates the skin temperature of at least one of the exterior of the case, the interior of the case, and a portion of the case that defines a channel through which the synthetic jet is configured to pass a fluid.

11. An apparatus configured to control a synthetic jet, comprising:
   means for receiving case temperature data indicating a skin temperature of a case; and
   means for initiating, if the skin temperature is greater than the skin temperature threshold, applying a control voltage to actuate the synthetic jet.

12. The apparatus of claim 11, further comprising means for reducing, if the skin temperature is greater than the skin temperature threshold, a clock frequency applied in an integrated circuit.

13. The apparatus of claim 11, further comprising:
   means for receiving junction temperature data indicating a junction temperature of an integrated circuit located in the case; and
   means for reducing, if the junction temperature is greater than a junction temperature threshold, a clock frequency applied in the integrated circuit.

14. The apparatus of claim 11, wherein the case temperature data indicates the skin temperature of at least one of the exterior of the case, the interior of the case, and a portion of the case that defines a channel through which the synthetic jet is configured to pass a fluid.

15. The apparatus of claim 11, wherein at least a part of the means for initiating applying the control voltage to actuate the synthetic jet is integrated on a semiconductor die.

16. The apparatus of claim 11, further comprising at least one of a mobile device, a terminal, a music player, a video player, an entertainment unit, a navigation device, a communications device, a personal digital assistant, a fixed location data unit, a tablet, and a computer, of which the means for initiating applying the control voltage to actuate the synthetic jet is a constituent part.

17. An apparatus configured to control a synthetic jet, comprising:
   a processor; and
   a memory coupled to the processor and configured to cause the processor to:
      receive case temperature data indicating a skin temperature of a case; and
      initiate, if the skin temperature is greater than a skin temperature threshold, applying a control voltage to actuate the synthetic jet.

18. The apparatus of claim 17, wherein the memory is further configured to cause the processor to reduce, if the skin temperature is greater than the skin temperature threshold, a clock frequency applied in an integrated circuit.

19. The apparatus of claim 17, wherein the memory is further configured to cause the processor to:
   receive junction temperature data indicating a junction temperature of an integrated circuit located in the case; and
   reduce, if the junction temperature is greater than a junction temperature threshold, a clock frequency applied in the integrated circuit.

20. The apparatus of claim 17, wherein the case temperature data indicates the skin temperature of at least one of the exterior of the case, the interior of the case, and a portion of the case that defines a channel through which the synthetic jet is configured to pass a fluid.

21. The apparatus of claim 17, wherein at least a part of the processor is integrated on a semiconductor die.

22. The apparatus of claim 17, further comprising at least one of a mobile device, a terminal, a music player, a video player, an entertainment unit, a navigation device, a communications device, a personal digital assistant, a fixed location data unit, a tablet, and a computer, with which the processor is integrated.

23. The apparatus of claim 17, wherein the processor is at least one of a microprocessor, a microcontroller, a digital signal processor, a field programmable gate array, a programmable logic device, an application-specific integrated circuit, a controller, a non-generic special-purpose processor, a state machine, gated logic, a discrete hardware component, and a dedicated hardware finite state machine.

24. A non-transitory computer-readable medium, comprising processor-executable instructions stored thereon configured to cause a processor to:
   receive case temperature data indicating a skin temperature of a case; and
   initiate, if the skin temperature is greater than a skin temperature threshold, applying a control voltage to actuate the synthetic jet.

25. The non-transitory computer-readable medium of claim 24, wherein the processor-executable instructions further include instructions to cause the processor to reduce, if the skin temperature is greater than the skin temperature threshold, a clock frequency applied in an integrated circuit.

26. The non-transitory computer-readable medium of claim 24, wherein the processor-executable instructions further include instructions to cause the processor to:
   receive junction temperature data indicating a junction temperature of an integrated circuit located in the case; and
   reduce, if the junction temperature is greater than a junction temperature threshold, a clock frequency applied in the integrated circuit.

27. The non-transitory computer-readable medium of claim 24, wherein the case temperature data indicates the skin temperature of at least one of the exterior of the case, the interior of the case, and a portion of the case that defines a channel through which the synthetic jet is configured to pass a fluid.

* * * * *